United States Patent [19]

Chen et al.

[11] Patent Number: 5,998,809
[45] Date of Patent: Dec. 7, 1999

[54] ROOM TEMPERATURE 3-5 MICROMETER WAVELENGTH HGCDTE HETEROJUNCTION EMITTER

[75] Inventors: Men-Chee Chen, Dallas; Malcolm J. Bevan, Garland, both of Tex.

[73] Assignee: Raytheon Company, Lexington, Mass.

[21] Appl. No.: 08/726,182

[22] Filed: Oct. 4, 1996

Related U.S. Application Data

[60] Provisional application No. 60/004,909, Oct. 6, 1995.

[51] Int. Cl.[6] .............................. H01L 33/00; H05B 33/14
[52] U.S. Cl. .............................. 257/101; 257/94; 257/96; 257/102; 257/103
[58] Field of Search ................................ 257/103, 96, 97, 257/79, 94, 102

[56] References Cited

U.S. PATENT DOCUMENTS

| | | | |
|---|---|---|---|
| 4,122,407 | 10/1978 | Van Vechten | 331/94.5 H |
| 4,357,620 | 11/1982 | Wang et al. | 357/16 |
| 4,660,207 | 4/1987 | Svilans | 357/17 |
| 4,970,567 | 11/1990 | Ahlgren et al. | 357/30 |
| 4,999,694 | 3/1991 | Austin et al. | 357/30 |
| 5,028,561 | 7/1991 | Kamath et al. | 437/105 |
| 5,391,882 | 2/1995 | Rhiger | 250/370.13 |
| 5,394,826 | 3/1995 | Ebe et al. | 117/101 |
| 5,412,242 | 5/1995 | Cahen et al. | 257/442 |
| 5,456,207 | 10/1995 | Gedridge, Jr. et al. | 117/104 |
| 5,535,699 | 7/1996 | Kawazu et al. | 117/1 |
| 5,663,564 | 9/1997 | Radford | 250/338.4 |
| 5,882,805 | 3/1999 | Higa et al. | 428/689 |
| 5,900,630 | 5/1999 | Tang et al. | 250/338.4 |

OTHER PUBLICATIONS

Wayne Lo, et al., "Room–temperature 4.6–$\mu$m light emitting diodes," *Appl. Phys. Lett*, Mar. 15, 1980, pp. 450–451.
M.Aidaraliev, et al., "Spontaneous and Stimulated Emission from InAsSbP/InAs Heterostructures,"*Phys. Stat. Sol. –A. F. Ioffe Physico–Technical Institute*,1989, pp. K117–K120.

A. Krier, "Room–temperature $InAs_xSb_yP_{1-x-y}$light –emitting diodes for $CO_2$ detection ar 4.2 $\mu$m,"*Appl. Phys. Lett.*, Jun. 11, 1990, pp. 2428–2429.

R. Zucca, et al., "HgCdTe double heterostructure diode lasers grown by molecular–beam epitaxy," *J. Vac. Sci. Technol.*, Jul./Aug. 1992, pp. 1587–1593.

M. C. Chen, et al., "Minority–carrier lifetime in indium–doped n–type $Hg_{0.78}Cd_{0.22}Te$ liquid–phase–epitaxial films," *Journal of Applied Physics*, Nov. 1992, pp. 4761–4766.

(List continued on next page.)

*Primary Examiner*—Jerome Jackson, Jr.
*Assistant Examiner*—Bradley William Baumeister
*Attorney, Agent, or Firm*—Baker & Botts, L.L.P.

[57] ABSTRACT

A room temperature emitter (10) operating in the 3–5 $\mu$m wavelength range is provided. The emitter (10) includes a substrate (12) formed of a material selected from the group comprising cadmium telluride or cadmium zinc telluride. An epitaxial active layer (14) is formed over the substrate (12) from mercury cadmium telluride. The active layer (14) may be either a p-type or an n-type layer. The active layer (14) is doped with a predetermined concentration of dopant selected from the group comprising indium and arsenic. More particularly, if the active layer (14) is a p-type layer, it is doped with arsenic in a concentration between approximately $1\times10^{16}$ atoms/cm$^3$ and $1\times10^{17}$ atoms/cm$^3$. If the active layer (14) is an n-type layer, it is doped with indium in a concentration between approximately $5\times10^{14}$ atoms/cm$^3$ to $1\times10^{15}$ atoms/cm$^3$. A first epitaxial confinement layer (16) is formed from mercury cadmium telluride. The first confinement layer (16) is formed over the active layer (14). The first confinement layer (16) may be either an n[+]layer or a p[+]layer, depending upon whether the active layer (14) is a p-type or n-type layer. A metal layer (18) is formed over the first confinement layer (16).

20 Claims, 1 Drawing Sheet

OTHER PUBLICATIONS

Ph. Bouchut, et al., "Low Threshold Injection Laser in HgCdTe," *Journal of Electronic Materials,* 1993, pp. 1061–1065.

T. Ashley, et al., "Room–temperature electroluminescence at wavelengths of 5–7 μm from HgCdTe heterostructure diodes," *Appl. Phys. Lett.,* Oct. 31, 1994, pp. 2314–2316.

M. C. Chen, et al., "The Minority Carrier Lifetime in Doped and Undoped p–Type $Hg_{0.78}Cd_{0.22}Te$ Liquid Phase Epitaxy Films," *Journal of electronic Materials*, 1995, pp. 539–544.

Tarry, H.A., et al., Infra–Red Electroluminescence From $Cd_xHg_{1-x}Te$ Diodes, Electron. Lett., vol. 22 No. 8., pp. 416–418, Apr. 10, 1986.

Bouchut et al. "High–efficiency infrared light emitting diodes made in liquid phase epitaxy and molecular beam epitaxy HgCdTe layers," J. Vac. Sci. Technol., May/Jun. 1991, pp. 1794–1798. 1991.

ND JUNCTION EMITTER

This application claims benefit of Provisional Application No. 60/004,909 filed Oct. 6, 1995.

TECHNICAL FIELD OF THE INVENTION

This invention relates generally to light emitting devices, and more particularly, to semiconductor light emitting diodes (LEDs) and lasers which operate at room temperature in the 3–5 μm wavelength range and their method of manufacture.

BACKGROUND OF THE INVENTION

All gases absorb light energy. For any particular gas, however, there is an associated absorption band for light energy known as that gas's signature band. A gas will absorb light energy having a wavelength that falls within its signature band. For example, carbon monoxide (CO) absorbs light with a wavelength of 4.6 μm.

Semiconductor LEDs and laser emitters (hereinafter "emitters") can be fabricated to emit light energy at specific wavelengths. A gas having a signature band at one of those wavelengths will readily absorb the emitted light. Consequently, the intensity of the emitted light is inversely related to the concentration of gas through which the light has passed. Because of the relatively good gas absorption characteristics of infrared light, infrared emitters are used in certain gas detection systems. For example, infrared emitters operating in the 3–5 μm wavelength range are used in conjunction with infrared sensing devices to detect and measure concentrations of noxious gases, such as carbon dioxide ($CO_2$), carbon monoxide (CO), nitrous oxide ($N_2O$), trioxide ($O_3$), or sulfur dioxide ($SO_2$). In that regard, 3–5 μm emitters have been very useful in environmental monitoring, medical diagnostics, and industrial process control applications.

Nevertheless, there have been numerous problems with existing infrared emitters. For example, although 3–5 μm emitters have been formed from epitaxial films made of indium arsenic antimony phosphorous (InAsSbP) materials, substrate materials that could be lattice-matched to those films did not exist. Consequently, the performance of InAsSbP emitters has been somewhat limited.

Infrared emitters also have been formed from mercury cadmium telluride (HgCdTe) materials. The HgCdTe emitters can be lattice-matched to certain substrate materials. However, operating at the 3–5 μm wavelength range, HgCdTe emitters had to be cooled with refrigerants or cryogenics equipment, since they functioned properly only at temperatures much lower than 100° K. Such cooling equipment is relatively bulky and expensive, which has increased the space requirements and cost of previous 3–5 μm HgCdTe emitters.

Accordingly, a need exists for a 3–5 μm emitter, which can be lattice-matched to a substrate material and can also operate at ambient or room temperatures.

SUMMARY OF THE INVENTION

In accordance with the teachings of the present invention, the disadvantages and problems associated with previously developed emitters have been substantially reduced or eliminated.

According to an embodiment of the present invention, a room temperature emitter operating in the 3–5 μm wavelength range is provided. The emitter includes a substrate formed of a material selected from the group comprising cadmium telluride or cadmium zinc telluride. An epitaxial active layer is formed over the substrate from mercury cadmium telluride. The active layer may be either a p-type or an n-type layer. The active layer is doped with a predetermined concentration of dopant selected from the group comprising indium and arsenic. More particularly, if the active layer is a p-type layer, it is doped with arsenic in a concentration between approximately $1 \times 10^{16}$ atoms/cm$^3$ to $1 \times 10^{17}$ atoms/cm$^3$. If the active layer is an n-type layer, it is doped with indium in a concentration between approximately $5 \times 10^{14}$ atoms/cm$^3$ to $1 \times 10^{15}$ atoms/cm$^3$. A first epitaxial confinement layer is formed from mercury cadmium telluride, where the first confinement layer is formed over the active layer. The first confinement layer may be either an n$^+$layer or a p$^+$layer, depending upon whether the active layer is a p-type or n-type layer. A metal layer is formed over the first confinement layer.

According to another embodiment of the present invention, a method for forming a room temperature emitter operating in the 3–5 μm wavelength range is provided. The method includes a plurality of steps. Those steps are: providing a substrate formed of a material selected from the group comprising cadmium telluride or cadmium zinc telluride; forming an epitaxial active layer over the substrate from mercury cadmium telluride; selecting a dopant from either arsenic in a concentration between approximately $1 \times 10^{16}$ atoms/cm$^3$ to $1 \times 10^{17}$ atoms/cm$^3$ or indium in a concentration between approximately $5 \times 10^{14}$ atoms/cm$^3$ to $1 \times 10^{15}$ atoms/cm$^3$; doping the active layer with the selected dopant; forming a first epitaxial confinement layer from mercury cadmium telluride, where the first confinement layer is formed over the active layer; and forming a metal contact over the first confinement layer.

An important technical advantage of the present invention is that a 3–5 μm emitter is formed that is functional at room temperatures, which reduces the overall size requirements and cost of the device.

Another important technical advantage of the present invention is that an infrared emitter can be formed with a heterostructure which has a larger minority carrier injection efficiency than that of a simple p-n junction. Also, the heterostructure formed in accordance with the invention has a plurality of passivation layers that prevent degradation.

Yet another important technical advantage of the present invention is that a substrate material is provided with a lattice structure matched to that of the emitter, which increases the overall performance of the device.

Another important technical advantage of the present invention is that dopants can be used in forming the emitter, which minimize the Shockley-Read-Hall process effects in the device, and thus increase its performance.

Still another important technical advantage of the present invention is that a substrate material is formed that does not absorb light energy in the 3–5 μm wavelength range, which increases the optical efficiency of the emitter.

BRIEF DESCRIPTION OF THE DRAWINGS

For a more complete understanding of the present invention, and the advantages thereof, reference is now made to the following description taken in conjunction with the accompanying drawings, in which.

DETAILED DESCRIPTION OF THE INVENTION

Figure 1:
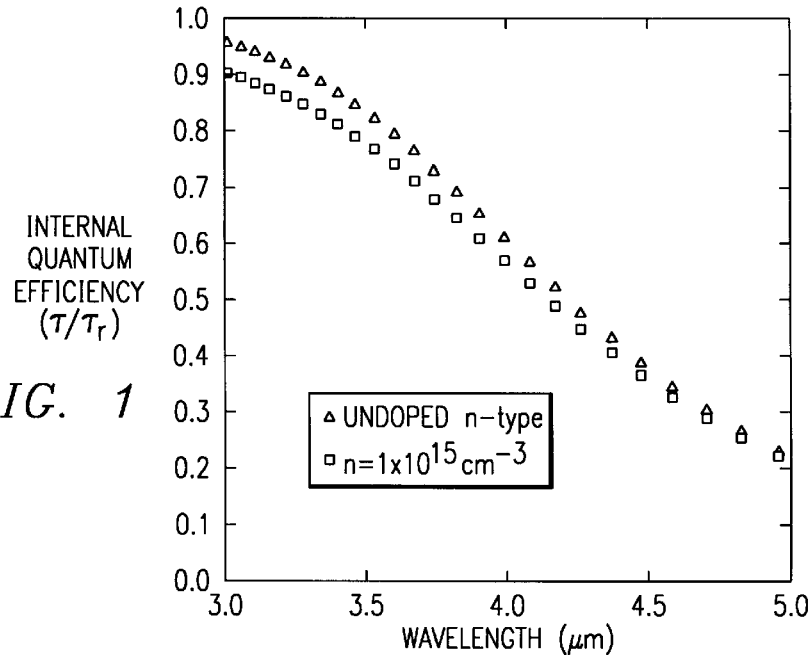
FIG. 1 is a graph illustrating the internal quantum efficiency ($\eta_i$) value of n-type HgCdTe material as a function of wavelength at room temperature.

This provisional application is related by common subject matter to provisional application (Attorneys Docket No. TI-19088) filed Oct. 6, 1995.

The preferred embodiment of the present invention and its advantages are best understood by referring to FIGS. 1–4 of the drawings, like numerals being used for like and corresponding parts of the various drawings.

HgCdTe has been recognized as a promising material for infrared emitters due to its unique physical, thermal, and electrical characteristics. For example, HgCdTe is a semiconductor material having a tunable bandgap. In other words, the wavelength of the light energy emitted from an HgCdTe emitter can be predetermined by selecting appropriate dopant concentrations used during the devices fabrication. Consequently, in one aspect of the invention, an HgCdTe emitter structure can be selectively formed to emit light with a wavelength falling within a gas's signature band. Furthermore, HgCdTe material may be lattice-matched to certain substrates, such as cadmium telluride (CdTe) or cadmium zinc telluride (CdZnTe). Thus, as will be explained below, emitters formed of HgCdTe material may perform more efficiently than emitters which do not have lattice-matched substrates.

Emitters formed of semiconducting material, such as HgCdTe, operate in the following manner. An electrical source is used to excite the semiconducting material, thereby producing discrete pairs of charged minority and majority carriers. This excitation process is also known as "injection" of minority carriers. For n-type semiconducting material, the majority carriers are negatively charged electrons; for p-type semiconducting material, the majority carriers are positively charged holes. When the minority carriers recombine with the majority carriers, light is produced. Because there are necessarily fewer minority carriers than majority carriers by definition, the light-producing recombination processes are limited by the number of minority carriers.

The recombination of any minority carrier with a majority carrier may occur through one of several processes: radiative, Auger, or Shockley-Read-Hall. Auger and Shockley-Read-Hall processes are considered to be non-radiative processes.

Auger processes are a function of the total concentration of minority carriers in a material. That is, as the concentration of minority carriers in a material increases, the number of Auger processes will increase. Auger processes may be distinguished between Auger 7 processes which operate on holes and Auger 1 processes which operate on electrons. Furthermore, because minority carrier concentration increases when the desired operating wavelength for an emitter is increased, the number of Auger processes will likewise increase.

Shockley-Read-Hall processes are related to impurities in a material. In particular, certain dopants which are used to dope HgCdTe material create defects in the material. An increased number of these defects cause the number of Shockley-Read-Hall processes to increase.

The manner in which minority carriers recombine with majority carriers in an emitter affects its internal quantum efficiency, $\eta_i$. Considered to be the key material parameter governing the overall efficiency of an emitter, $\eta_i$ is the ratio of optical power produced by an emitter versus the electrical power input into the emitter. With regard to recombination processes, $\eta_i$ is a measure of the effectiveness of radiative recombination processes relative to the non-radiative Auger and Shockley-Read-Hall recombination processes.

$\eta_i$ may be defined by the following equation:

$$\eta_i = \tau/\tau_R \tag{1}$$

where $\tau$ is total lifetime and $\tau_R$ is radiative lifetime. Equation (1) shows that as the value of $\tau$ approaches the value of $\tau_R$, $\eta_i$ increases. Furthermore, $\tau$ may be expressed as follows:

$$\tau = (1/\tau_A + 1/\tau_R + 1/\tau_{SRH})^{-1} \tag{2}$$

where $\tau_A$ is Auger lifetime and $\tau_{SRH}$ is Shockley-Read-Hall lifetime. $\tau$ in equation (1) may be substituted with its formula in equation (2). This substitution indicates that if the number of recombinations occurring through radiative processes is increased relative to the number of recombinations occurring through non-radiative processes, $\eta_i$ will increase. Thus, it is desirable to maximize the number of radiative recombinations relative to the number of non-radiative recombinations in order to produce emitters with the highest $\eta_i$.

As stated above, however, the number of Auger processes increases as the desired operating wavelength for an emitter is increased. Furthermore, some materials used to dope emitters create defects, which, in turn, cause Shockley-Read-Hall processes. Consequently, the $\eta_i$ value for emitters decreases with both increases in operating wavelength and certain kinds of dopants.

According to the present invention, emitters in the 3–5 $\mu$m wavelength range have been designed to operate at room temperature by calculating the $\eta_i$ value over a wide range of compositions and doping concentrations. In particular, the present invention provides: (1) specific doping concentrations for HgCdTe material that produce emitters in the 3–5 $\mu$m wavelength range having high $\eta_i$ values at room temperature and (2) choices of dopants for HgCdTe material that do not produce $\eta_i$-reducing Shockley-Read-Hall processes.

FIG. 1 is a graph that illustrates the calculated $\eta_i$ value of two kinds of emitters formed of n-type HgCdTe material. One kind is made of undoped n-type material, and the other kind is made of doped n-type material having a doping concentration of $1 \times 10^{15}$ atoms/cm$^3$. The $\eta_i$ for both kinds of emitters is shown as a function of operating wavelength in the 3–5 $\mu$m range at room-temperature, where different wavelengths correspond to different proportions of Hg and Cd.

FIG. 1 clearly shows the inverse relationship between the operating wavelength of an emitter and the $\eta_i$ of the emitter. In particular, the $\eta_i$ value for both kinds of emitters decreases from more than 90% at an operating wavelength of 3 $\mu$m to less than 25% at an operating wavelength of 5 $\mu$m. This phenomenon may be explained as follows.

Although it is not specifically stated in FIG. 1, both the undoped and doped n-type material have a large intrinsic minority carrier concentration of electrons. This intrinsic electron concentration increases as the desired operating wavelength for an emitter is increased. More specifically, intrinsic electron concentration for HgcdTe material is approximately $4\times10^{14}$ atoms/cm$^3$ at an operating wavelength of 3 μm, but increases to approximately $9.2\times10^{15}$ atoms/cm$^3$ at a wavelength of 5 μm. Because Auger processes are a function of the electron concentration in n-type material, the number of Auger processes also increases when the desired operating wavelength is increased. Auger processes reduce $\eta_i$ value. Consequently, $\eta_i$ value decreases as the operating wavelength is increased.

Figure 2:
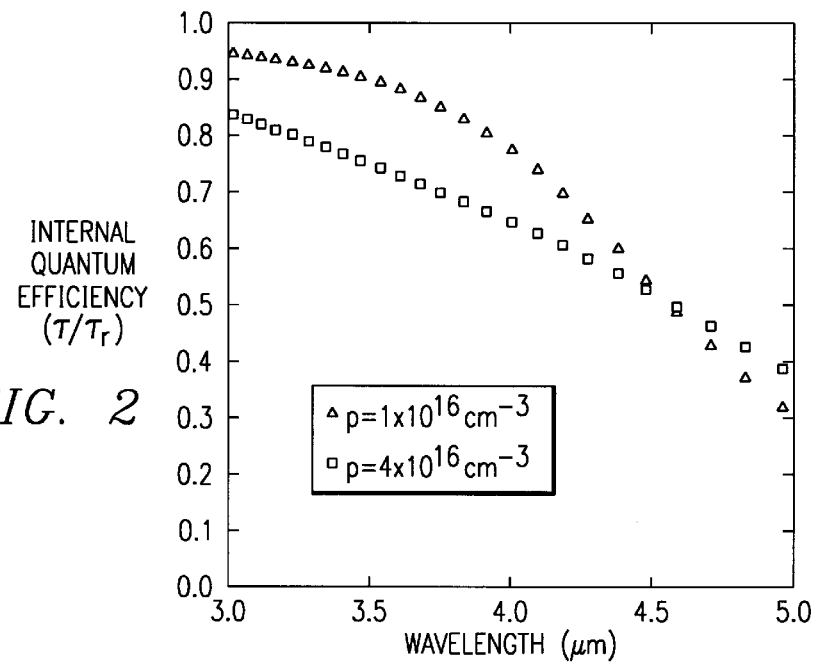
FIG. 2 is a graph illustrating the $\eta_i$ value of p-type doped HgCdTe material as a function of wavelength at room-temperature.

FIG. 2 is a graph that illustrates the calculated $\eta_i$ value for two kinds of emitters formed of p-type HgCdTe material. One is made of doped p-type material having a doping concentration of $1\times10^{16}$ atoms/cm$^3$, and the other is made of doped p-type material having a doping concentration of $4\times10^{-16}$ atoms/cm$^3$. The $\eta_i$ value for both kinds of emitters is shown as a function of wavelength in the 3–5 μm range at room-temperature, where different wavelengths correspond to different proportions of Hg and Cd.

P-type HgCdTe material has an intrinsic hole concentration similar to the intrinsic electron concentration of n-type. Also, like the intrinsic electron concentration, this intrinsic hole concentration increases with increasing wavelength. Thus, the intrinsic hole concentration for HgCdTe material is approximately $4\times10^{14}$ atoms/cm$^3$ at an operating wavelength of 3 μm, and increases to approximately $9.2\times10^{15}$ atoms/cm$^3$ at a wavelength of 5 μm. Because the number of Auger processes increases with the increase in hole concentration, $\eta_i$ for these emitters decreases as operating wavelength is increased. More specifically, $\eta_i$ decreases from over 80% at 3 μm wavelength to less than 35% at 5 μm wavelength.

A comparison between the graphs of FIG. 1 and FIG. 2 shows two notable differences between emitters formed of n-type material and emitters formed of p-type material in this 3–5 μm wavelength range.

First, the $\eta_i$ value for emitters formed of p-type doped HgcdTe material decreases more slowly with increasing wavelength than for emitters formed of n-type HgCdTe material. For example, at 4.6 μm $\eta_i$ is about 50% for both kinds of emitters made of doped p-type materials; at the same wavelength, $\eta_i$ is about 35% for emitters made of undoped n-type material and about 33% for emitters made of the doped n-type material.

Second, in FIG. 1, the $\eta_i$ for emitters made of undoped n-type material is consistently higher than the $\eta_i$ for emitters made of doped n-type material, throughout the 3–5 μm wavelength range. By contrast, in FIG. 2, the $\eta_i$ for one kind of emitter made of doped p-type material does not remain consistently higher than the $\eta_i$ for the other kind of emitter throughout the infrared range. That is, at wavelengths between approximately 3–4.5 μm, the $\eta_i$ for emitters made of p-type material having a doping concentration of $1\times10^{16}$ atoms/cm$^3$ is higher than the $\eta_i$ for the other kind of emitters made of p-type material. At wavelengths between approximately 4.5–5 μm, the $\eta_i$ for emitters made of p-type material having a doping concentration of $4\times10^{16}$ atoms/cm$^3$ is higher.

These two differences between the graphs shown in FIGS. 1 and 2 can be explained by the distinction in Auger processes. Auger 7 processes operate on holes, the minority carrier in p-type material. Auger 1 processes operate on electrons, the minority carrier in n-type material. The effect of Auger 1 processes on $\eta_i$ is approximately twenty times greater than the effect of Auger 7 processes on $\eta_i$. Thus, Auger processes do not reduce the $\eta_i$ value of emitters made of p-type material as severely as they reduce the $\eta_i$ value of emitters made of n-type material.

Based on calculated $\eta_i$ curves such as those illustrated in FIGS. 1 and 2, infrared emitters may be formed according to the present invention. More specifically, emitters in the 3–5 μm wavelength range operating at room temperature and having lattice-matched substrates are provided.

According to the present invention, the emitters may be LEDs or lasers. LEDs may be formed either as heterostructure devices or double heterostructure devices. Lasers may be formed as double heterostructure devices, but not heterostructure devices. Heterostructures have a high "injection" efficiency of minority carriers. That is, a large number of discrete pairs of minority and majority carriers is produced by the electrical power that is input into the heterostructures.

Figure 3:
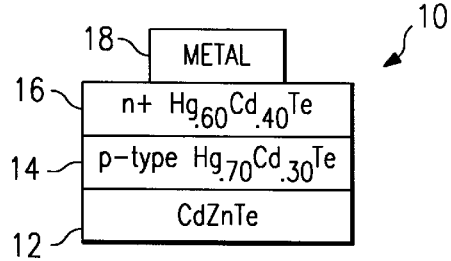
FIG. 3 is a cross-sectional view of a heterostructure device according to an embodiment of the present invention.

FIG. 3 illustrates a heterostructure device 10 according to one embodiment of the present invention. Heterostructure device 10 may be a device structure for a room-temperature LED. Heterostructure device 10 includes a substrate 12, preferably made of a lattice-matched CdTe or CdZnTe crystal. Lattice-matching substrate 12 to an adjacent layer reduces the strain between the structure of the substrate and the structure of the adjacent layer; lattice-matching also reduces the number of defects. Substrate 12 is grown using any one of several known techniques, such as horizontal Bridgeman process.

A p-type HgCdTe active (light-emitting) layer 14 is formed on substrate 12. Active layer 14 may be grown as an epitaxial film using metalorganic chemical vapor deposition (MOCVD) or molecular beam epitaxy (MBE) Depending upon the desired operating wavelength, p-type active layer 14 may be doped with varying amounts of arsenic (As). More specifically, for LEDs operating in the 3–4 μm wavelength range, active layer 14 is doped with As in a moderate-to-high concentration—e.g., between approximately $1\times10^{16}$ atoms/cm$^3$ to $1\times10^{17}$ atoms/cm$^3$. For LEDs operating in the 4–5 μm wavelength range, active layer 14 is doped with As in a moderate concentration—e.g., between approximately $1\times10^{16}$ atoms/cm$^3$ to $5\times10^{16}$ atoms/cm$^3$. The dopant may be incorporated during the growth of active layer 14. The material composition for active layer 14 may be defined as $Hg_{1-Y}Cd_YTe$, where the subscripts 1-Y and Y establish the proportion of Hg relative to Cd. Thus, if 1-Y=0.70 and Y=0.30, then active layer 14 contains 0.70 units of Hg for every 0.30 units of Cd.

An n$^+$HgCdTe confinement layer 16 is formed over active layer 14. Confinement layer 16 may also be grown as an epitaxial film by MOCVD or MBE. The composition for confinement layer 16 is defined as $Hg_{1-X}Cd_XTe$, where X >Y, Y being the defining variable in the composition for active layer 14. The subscripts 1-X and X establish the proportion of Hg relative to Cd in confinement layer 16. Therefore, if 1-X=0.60 and X=0.40, then confinement layer 16 contains 0.60 units of Hg for every 0.40 units of Cd. Accordingly, as shown in the embodiment of FIG. 3, the composition for active layer 14 may be expressed as $Hg_{0.70}Cd_{0.30}Te$, and the composition for confinement layer 16 may be expressed as $Hg_{0.60}Cd_{0.40}Te$. Confinement layer 16 acts as a passivation layer; that is, confinement layer 16 prevents the drift of minority carriers out of active layer 14.

A metal layer 18 is formed over confinement layer 16 using any one of several processes, such as evaporated metallization. Metal layer 18 serves as a contact through which an electrical charge may be used to excite heterostructure 10. Metal layer 18 is made from any of a variety of metals and metal alloys, such as chromium gold.

Alternatively, heterostructure device 10 may be structured as an n-type HgCdTe active layer 14 and a p$^+$HgCdTe confinement layer 16. Active layer 14 and confinement layer 16 are successively grown on a lattice-matched substrate, preferably made of CdTe or CdZnTe. N-type active layer 14 is preferably doped with indium (In). More specifically, for LEDs in the 3–5 µm range, active layer 14 may be doped with In in low concentration—e.g., between approximately $5 \times 10^{14}$ atoms/cm$^3$ to $1 \times 10^{15}$ atoms/cm$^3$.

Figure 4:
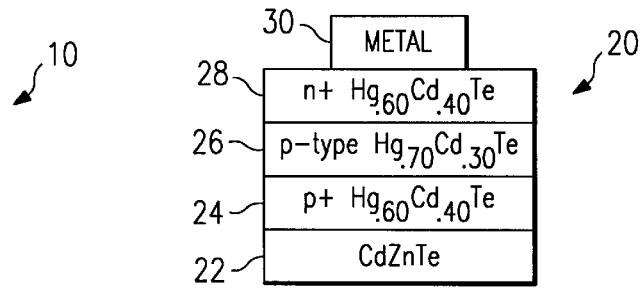
FIG. 4 is a cross-sectional view of a double heterostructure device according to a second embodiment of the present invention.

FIG. 4 illustrates a double heterostructure device 20 according to a second embodiment of the present invention. Double heterostructure device 20 may be a device structure for a room-temperature LED or laser. Double heterostructure device 20 includes a substrate 22, preferably formed of a CdTe or CdZnTe crystal that is lattice-matched. Substrate 22 may be grown by horizontal Bridgeman process.

A p$^+$HgCdTe confinement layer 24 is formed on substrate 22. Confinement layer 24 may be grown as an epitaxial film by MOCVD or MBE. The material composition for the p$^+$confinement layer 24 may be defined as $Hg_{1-Z}Cd_ZTe$, where the subscripts 1-Z and Z establish the proportion of Hg relative to Cd. Therefore, if 1-Z=0.60 and Z=0.40, then confinement layer 24 contains 0.60 units of Hg for every 0.40 units of Cd. Confinement layer 24 acts as a passivation layer.

A p-type HgCdTe active layer 26 is formed over confinement layer 24. Active layer 26 emits light. Active layer 26 may be grown on confinement layer 24 by MOCVD or MBE. Depending upon the operating wavelength of double heterostructure device 20, active layer 26 is doped with a certain concentration of dopant. For LEDs or lasers operating in the 3–4 µm wavelength range, active layer 26 is preferably doped with As in a moderate-to-high concentration—e.g., between approximately $1 \times 10^{16}$ atoms/cm$^3$ to $1 \times 10^{17}$ atoms/cm$^3$. For LEDs or lasers operating in the 4–5 µm wavelength range, active layer 26 is preferably doped with As in a moderate concentration—e.g., between approximately $1 \times 10^{16}$ atoms/cm$^3$ to $5 \times 10^{16}$ atoms/cm$^3$. The composition for active layer 26 may be defined as $Hg_{1-Y}Cd_YTe$, where Y<Z, Z being the defining variable in the composition for confinement layer 24. The subscripts 1-Y and Y establish the proportion of Hg relative to Cd in active layer 26. Thus, if 1-Y=0.70 and Y=0.30, then active layer 26 contains 0.70 units of Hg for every 0.30 units of Cd. As shown in FIG. 4, for example, the composition for confinement layer 24 may be expressed as $Hg_{0.60}Cd_{0.40}Te$, and the composition for active layer 26 may be expressed as $Hg_{0.70}Cd_{0.30}Te$.

An n$^+$HgCdTe confinement layer 28 is formed over active layer 26. Confinement layer 28 may be grown as an epitaxial film on active layer 26 using MOCVD or MBE. The composition for the confinement layer 28 may be defined as $Hg_{1-X}Cd_XTe$, where X>Y, Y being the defining variable in the composition for active layer 26. The subscripts 1-X and X establish the proportion of Hg relative to Cd in confinement layer 28. Thus, if 1-X=0.60 and X=0.40, then confinement layer 28 contains 0.60 units of Hg for every 0.40 units of Cd. Accordingly, relative to active layer 26 shown in FIG. 4, the composition for confinement layer 28 may be expressed as $Hg_{0.60}Cd_{0.40}Te$. Like confinement layer 24, confinement layer 28 acts as a passivation layer.

A metal layer 30 is formed over confinement layer 28 by evaporated metallization or some other known technique. Metal layer 30 may be made from any of a variety of metals or alloys, such as chromium gold.

Alternatively, double heterostructure device 20 may be structured as an n$^+$HgCdTe confinement layer 24, an n-type HgCdTe active layer 26, and a p$^+$HgCdTe confinement layer 28. Confinement layer 24, active layer 26, and confinement layer 28 are successively grown on a lattice-matched CdTe or CdZnTe substrate. For LEDs or lasers in the 3–5 µm range, active layer 26 is preferably doped with In in low concentration—e.g., between approximately $5 \times 10^{14}$ atoms/cm$^3$ to $1 \times 10^{15}$ atoms/cm$^3$.

Although the present invention and its advantages have been described in detail, it should be understood that various changes, substitutions, and alterations can be made herein without departing from the spirit and scope of the invention as defined by the appended claims.

What is claimed is:

1. An apparatus comprising an emitter operable at room temperature in a 3–5 micrometer wavelength range, said emitter including:

a substrate formed from a material selected from the group consisting of cadmium telluride and cadmium zinc telluride;

a p-type epitaxial active layer formed over the substrate from mercury cadmium telluride doped with arsenic, where the arsenic is doped in a concentration between approximately $1 \times 10^{16}$ atoms/cm$^3$ to $1 \times 10^{17}$ atoms/cm$^3$;

a first n$^+$epitaxial confinement layer formed from mercury cadmium telluride, where the first n$^+$confinement layer is formed over the p-type active layer; and a metal layer formed over the first n$^+$confinement layer.

2. The apparatus of claim 1, wherein the proportion of mercury to cadmium in the p-type active layer is greater than the proportion of mercury to cadmium in the first n$^+$confinement layer.

3. The apparatus of claim 1, wherein:

the p-type active layer contains about 0.70 units of mercury for every 0.30 units of cadmium; and the first n$^+$confinement layer contains about 0.60 units of mercury for every 0.40 units of cadmium.

4. The apparatus of claim 1, further comprising a second p$^+$confinement layer formed from a mercury cadmium telluride epitaxial layer disposed between the substrate and the p-type active layer.

5. The apparatus of claim 4, wherein:

the proportion of mercury to cadmium in the first n$^+$confinement layer is less than the proportion of mercury to cadmium in the p-type active layer; and the proportion of mercury to cadmium in the p-type active layer is greater than the proportion of mercury to cadmium in the second p$^+$confinement layer.

6. The apparatus of claim 4, wherein:

the first n$^+$confinement layer contains about 0.60 units of mercury for every 0.40 units of cadmium;

the p-type active layer contains about 0.70 units of mercury for every 0.30 units of cadmium; and the second p$^+$confinement layer contains about 0.60 units of mercury for every 0.40 units of cadmium.

7. The apparatus of claim 1, wherein the metal layer is formed from chromium gold.

8. The apparatus of claim 1, wherein the emitter is formed as a structure selected from the group consisting of a light emitting diode and a laser.

9. An apparatus comprising an emitter operable at room temperature in a 3–5 micrometer wavelength range, said emitter including:

a substrate formed from a material selected from the group consisting of cadmium telluride and cadmium zinc telluride;

an n-type epitaxial active layer formed over the substrate from mercury cadmium telluride doped with indium, where the indium is doped in a concentration between approximately $5 \times 10^{14}$ atoms/cm$^3$ to $1 \times 10^{15}$ atoms/cm$^3$;

a first p$^+$epitaxial confinement layer formed from mercury cadmium telluride, where the first p$^+$confinement layer is formed over the n-type active layer; and a metal layer formed over the first p$^+$confinement layer.

10. The apparatus of claim 9, wherein the proportion of mercury to cadmium in the n-type active layer is greater than the proportion of mercury to cadmium in the first p$^+$confinement layer.

11. The apparatus of claim 9, wherein:

the n-type active layer contains about 0.70 units of mercury for every 0.30 units of cadmium; and the first p$^+$confinement layer contains about 0.60 units of mercury for every 0.40 units of cadmium.

12. The apparatus of claim 9, further comprising a second n$^+$confinement layer formed from a mercury cadmium telluride epitaxial layer disposed between the substrate and the n-type active layer.

13. The apparatus of claim 12, wherein:

the proportion of mercury to cadmium in the first p$^+$confinement layer is less than the proportion of mercury to cadmium in the n-type active layer; and the proportion of mercury to cadmium in the n-type active layer is greater than the proportion of mercury to cadmium in the second n$^+$confinement layer.

14. The apparatus of claim 12, wherein:

the first p$^+$confinement layer contains about 0.60 units of mercury for every 0.40 units of cadmium;

the n-type active layer contains about 0.70 units of mercury for every 0.30 units of cadmium; and the second n$^+$confinement layer contains about 0.60 units of mercury for every 0.40 units of cadmium.

15. The apparatus of claim 9, wherein the emitter is formed as a structure selected from the group consisting of a light emitting diode and a laser.

16. An apparatus comprising an emitter operable at room temperature in a 3–5 micrometer wavelength range, said emitter including:

a substrate formed from a material selected from the group consisting of cadmium telluride and cadmium zinc telluride;

an epitaxial active layer formed over the substrate from mercury cadmium telluride doped with a material selected from the group consisting of arsenic in a concentration between approximately $1 \times 10^{16}$ atoms/cm$^3$ to $1 \times 10^{17}$ atoms/cm$^3$ and indium in a concentration between approximately $5 \times 10^{14}$ atoms/cm$^3$ to $1 \times 10^{15}$ atoms/cm$^3$;

a first epitaxial confinement layer formed from mercury cadmium telluride, where the first confinement layer is formed over the active layer; and a metal layer formed over the confinement layer.

17. The apparatus of claim 16, wherein the active layer is a p-type semiconductor material, and the first confinement layer is a material selected from the group consisting of an n$^+$-type and a p$^+$-type semiconductor material.

18. The apparatus of claim 16, wherein the active layer is an n-type semiconductor material, and the first confinement layer is a material selected from the group consisting of an n$^+$-type and a p$^+$-type semiconductor material.

19. The apparatus of claim 16, further including a second confinement layer formed from a mercury cadmium telluride epitaxial layer disposed between the substrate and the active layer, wherein the active layer is an p-type semiconductor material, one of the first and second confinement layers is an n$^+$-type semiconductor material, and the other of the first and second confinement layers is an p$^+$-type semiconductor material.

20. The apparatus of claim 16, further including a second confinement layer formed from a mercury cadmium telluride epitaxial layer disposed between the substrate and the active layer, wherein the active layer is an n-type semiconductor material, one of the first and second confinement layers is an n$^+$-type semiconductor material, and the other of the first and second confinement layers is an p$^+$-type semiconductor material.

* * * * *

UNITED STATES PATENT AND TRADEMARK OFFICE
CERTIFICATE OF CORRECTION

PATENT NO. : 5,998,809
DATED : December 7, 1999
INVENTOR(S) : Men-Chee Chen, et al It is certified that error appears in the above-identified patent and that said Letters Patent is hereby corrected as shown below:

On the title page under item [54] and Column 1, in the title:

after "WAVELENGTH" please delete "HGCDTE" and insert --HgCdTe--.

Col. 5; Line 1, after "for", delete "HgcdTe", and insert --HgCdTe--.

Col. 5; Line 13, after "of", delete "$1x10^{16}$" and insert -- $1x10^{-16}$ --.

Signed and Sealed this

Twenty-fourth Day of April, 2001

Attest:

NICHOLAS P. GODICI

*Attesting Officer*   *Acting Director of the United States Patent and Trademark Office*